US012812911B2

(12) United States Patent
Baek et al.

(10) Patent No.: US 12,812,911 B2
(45) Date of Patent: Nov. 24, 2026

(54) GATE-ALL-AROUND FIELD-EFFECT TRANSISTOR WITH EXTENDED SOURCE/DRAIN

(71) Applicant: POSTECH Research and Business Development Foundation, Pohang-si (KR)

(72) Inventors: Rock-Hyun Baek, Pohang-si (KR); Sang Uk Lee, Pohang-si (KR)

(73) Assignee: POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 527 days.

(21) Appl. No.: 18/367,854

(22) Filed: Sep. 13, 2023

(65) Prior Publication Data

US 2024/0282839 A1 Aug. 22, 2024

(30) Foreign Application Priority Data

Feb. 17, 2023 (KR) ........................ 10-2023-0021300
Jun. 28, 2023 (KR) ........................ 10-2023-0083347

(51) Int. Cl.

| | |
|---|---|
| ***H10D 30/67*** | (2025.01) |
| ***H10D 30/01*** | (2025.01) |
| ***H10D 30/43*** | (2025.01) |
| ***H10D 30/62*** | (2025.01) |
| ***H10D 62/10*** | (2025.01) |
| ***H10D 62/17*** | (2025.01) |
| ***H10D 64/01*** | (2025.01) |

(52) U.S. Cl.
CPC ....... *H10D 30/6735* (2025.01); *H10D 30/014* (2025.01); *H10D 30/43* (2025.01); *H10D 30/62* (2025.01); *H10D 30/6757* (2025.01); *H10D 62/121* (2025.01); *H10D 62/371* (2025.01); *H10D 64/017* (2025.01); *H10D 62/10* (2025.01)

(58) Field of Classification Search
CPC .. H10D 30/6735; H10D 30/014; H10D 30/43; H10D 30/62; H10D 30/6757; H10D 62/121; H10D 62/371; H10D 64/017; H10D 62/10
See application file for complete search history.

(56) References Cited

U.S. PATENT DOCUMENTS

| | | | | |
|---|---|---|---|---|
| 9,653,289 | B1 * | 5/2017 | Balakrishnan ....... | H10D 62/121 |
| 9,991,352 | B1 * | 6/2018 | Frougier ............ | H10D 30/6757 |
| 2020/0052124 | A1 * | 2/2020 | Miao .................... | H10D 64/017 |

FOREIGN PATENT DOCUMENTS

| | | | |
|---|---|---|---|
| KR | 1020210095989 | A | 8/2021 |
| KR | 1020220001446 | A | 1/2022 |

* cited by examiner

*Primary Examiner* — David Vu
(74) *Attorney, Agent, or Firm* — Morgan, Lewis & Bockius LLP

(57) ABSTRACT

A gate-all-around field effect transistor with an extended source/drain and a method of manufacturing the same. The gate-all-around field effect transistor has an extended source/drain structure formed by partial etching of channels to solve unbalance between semiconductor devices and enables high speed operation through reduction in RC delay.

7 Claims, 15 Drawing Sheets

GATE-ALL-AROUND FIELD-EFFECT TRANSISTOR WITH EXTENDED SOURCE/DRAIN

TECHNICAL FIELD

The present invention relates to a gate-all-around field effect transistor with an extended source/drain and a method of manufacturing the same.

BACKGROUND

A three-dimensional gate-all-around field effect transistor (GAAFET) means a device in which all four sides of a channel are surrounded by a gate. Since the GAAFET allows stacking of channels unlike a FinFET, the GAAFET does not have a large lower end area occupied by the FET, which is advantageous in miniaturization and control of the number and widths of channels, despite increase in the number of channels.

In particular, since channels of a nanosheet (NS) GAAFET are surrounded by a gate metal, the GAAFET has enhanced gate controllability with respect to the channel and is less sensitive to process change by allowing formation of a source/drain through epitaxial growth. In addition, the GAAFET can achieve high performance due to a broad channel width for the same footprint, as compared with the FinFET.

A three-dimensional integrated circuit (3D-IC) has been widely studied in order to increase the number of transistors in a predetermined region. Since heat treatment of the uppermost device affects the lowermost device in the 3D-IC, it is necessary to prevent the lowermost device from being affected by heat treatment.

In rapid thermal annealing (RTA) most broadly used in the art, the entirety of a wafer is heated for activation of a source/drain (S/D). Due to such heat treatment, the lowermost device having finished the manufacturing process is also heated once more, thereby inevitably causing degradation in performance through migration of dopants in the source/drain to the channels. Although Patent Document 1 discloses that diffusion of the dopants can be blocked by wrapping the source/drain with a diffusion delay layer, this structure has a problem in that the manufacturing process is complicated.

Laser annealing is a process of irradiating a local region or a selected region with laser beams for a short period of time (Patent Document 2). By laser annealing, non-diffusive activation of the dopants in the source/drain occurs, thereby solving the problem of deterioration in performance and reliability of the 3D-IC. In addition, since laser annealing can suppress diffusion of the dopants to the channels unlike RTA causing diffusion of the dopants to the channels, laser annealing is a promising annealing process that can replace RTA on advanced nodes.

In general, the GAAFET has three types of parasitic resistance, that is, RCH (channel resistance) under a gate region, $R_{SD}$ (source/drain resistance) in a source/drain region, and $R_{EXT}$ (extended region resistance) under a spacer (that is, inner spacer). Since a region under the spacer has relatively low electrical conductivity, $R_{EXT}$ has large parasitic resistance and reduces on-state current of the device. In particular, when laser annealing is performed by heat treatment, diffusion of the dopants into an extended source/drain region is prevented, thereby causing significant deterioration in performance due to $R_{EXT}$. In particular, reduction in $R_{EXT}$ is very important for the GAAFET since $R_{EXT}$ is a much larger component of the GAAFET than a planar MOSFET or FinFET.

RELATED LITERATURE

Patent Document

KR Patent Laid-open Publication No. 10-2021-0095989 (Publication date: Aug. 4, 2021)

KR Patent Laid-open Publication No. 10-2022-0001446 (Publication date: Jan. 5, 2022)

SUMMARY

It is an object of the present invention to provide a GAAFET that reduces $R_{EXT}$ resistance.

According to the present invention, channels having high resistance are partially etched in order to reduce $R_{EXT}$ resistance. Reduction in parasitic resistance through partial etching of the channels having high resistance provides an effect of reducing RC delay. Typical technology for reducing channel length also reduces gate length, thereby causing a short-channel effect.

According to the present invention, in order to reduce $R_{EXT}$ in a region under a spacer without such a problem, a channel length under the spacer is reduced without changing an existing gate structure and an annealing process is performed after formation of a source/drain. As a result, dopants in the source/drain are diffused to a region having low electrical conductivity under the spacer without diffusion to the channel, thereby increasing electrical conductivity of the region, and on-state current is increased by increasing stress (attractive force/repulsive force) applied to the channels to achieve high-speed operation of the device and RC delay reduction.

According to the present invention, in order to reduce $R_{EXT}$ of the GAAFET device, the channel length is reduced without changing the gate length on the channels and portions of the source/drain at opposite sides of the channels extend to contact the opposite sides of the channels to achieve high-speed operation of the device and reduction in RC delay through increase in on-state current of the device without a short-channel effect.

In accordance with one aspect of the present invention, a gate-all-around field effect transistor includes: a plurality of channels formed on a substrate to be spaced apart from each other and each including a first side surface and a second side surface at opposite sides in one direction: a plurality of gate stacks each having a gate-all-around (GAA) structure surrounding at least a portion of the channel and including a first side surface and a second side surface at the opposite sides in the one direction: a source/drain disposed at one side of the gate stacks and contacting the plurality of channels; and a first internal spacer and a second internal spacer disposed between one side surface of at least one gate stack among the plurality of gate stacks and the source and between the other side surface of the at least one gate stack and the drain, respectively.

In one embodiment, in the one direction, a distance from one side surface of at least one channel among the plurality of channels to the other side surface thereof may be shorter than a distance from one side surface of the first internal spacer adjoining the source to one side surface of the second internal spacer adjoining the drain.

In one embodiment, in the one direction, a first end of a source region or a drain region adjacent the one side surface of the channel may extend beyond a second end of the source region or the drain region adjoining the first and second internal spacers.

In one embodiment, the first end of the source region may extend beyond the second end of the source region towards a center of the channel by a length less than a thickness of the first internal spacer.

In one embodiment, the first end of the drain region may extend beyond the second end of the drain region towards a center of the channel by a length less than a thickness of the second internal spacer.

In one embodiment, upper and lower surfaces of the source region adjoining the first end in the extended source region may adjoin the first internal spacer.

In one embodiment, upper and lower surfaces of the drain region adjoining the first end in the extended drain region may adjoin the second internal spacer.

In one embodiment, the substrate may be formed with a punch-through-stopper (PTS) region.

In one embodiment, a buried oxide (BOX) layer may be formed inside the substrate or between the substrate and the source/drain.

In one embodiment, upon formation of the source/drain, the source/drain may be formed to include etched regions formed by etching opposite ends of the channels and etching may be performed by a selective etching process depending upon materials of the channels and the internal spacer.

In one embodiment, an etching depth of the channels may be smaller than the thickness of the first or second internal spacer, specifically greater than 0% to less than 100% of the thickness of the first or second internal spacer.

The source/drain may be formed through selective epitaxial growth and may be subjected to laser annealing after formation of the source/drain.

The present technology improves on-state current and RC time of devices by forming an extended source/drain structure in a three-dimensional gate-all-around field effect transistor. Specifically, the present technology improves performance of the gate-all-around field effect transistor through increase in electrical conductivity of regions having low electrical conductivity under spacers while improving attractive force/tension applied to the channels. According to the present technology, a channel etching process is performed based on difference in selectivity between materials to reduce process tolerance, and other processes are the same as typical processes to improve applicability of the present technology.

The present technology is applicable to any semiconductor products employing the three-dimensional gate-all-around field effect transistor and provides effects of achieving high-speed operation through increase in on-state current while reducing RC delay.

BRIEF DESCRIPTION OF THE DRAWINGS

The above and other objects, features, and advantages of the present invention will become apparent from the detailed description of the following embodiments in conjunction with the accompanying drawings.

DETAILED DESCRIPTION OF EMBODIMENTS

Figure 1:
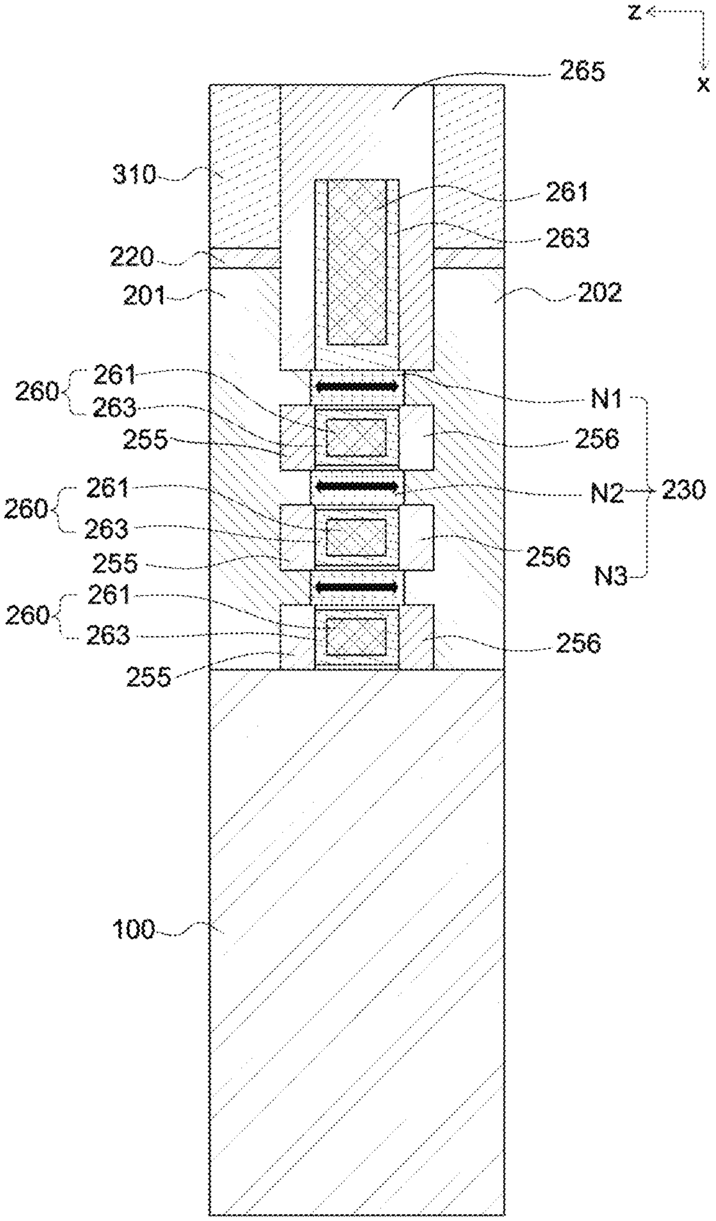
FIG. 1 is a sectional view of a GAAFET according to one embodiment of the present invention.

Hereinafter, exemplary embodiments of the present invention will be described with reference to the accompanying drawings. It should be understood that the present invention is not limited thereto and may be embodied in different ways. The following embodiments are provided for complete disclosure and thorough understanding of the present invention by those skilled in the art.

Herein, when an element or layer is referred to as being disposed on another element (or layer) or a substrate, it may be directly formed on the other element (layer) or the substrate or intervening elements (or layers) may be present therebetween. In the accompanying drawings, the sizes and thicknesses of elements may be exaggerated for clarity and descriptive purposes. Also, like reference numerals denote like elements. As used herein, the term "and/or" includes any and all combinations of one or more of the associated listed items. In addition, like elements are denoted by like reference numerals throughout the specification.

The terminology used herein is for the purpose of describing embodiments only and is not intended to limit the invention. As used herein, the singular forms "a", "an", and "the" are intended to include the plural forms as well, unless the context clearly indicates otherwise. It will be further understood that the terms "comprise", "include", "including" and/or "comprising" as used herein specify the presence of stated features, steps, operations, elements and/or components, but do not preclude the presence or addition of one or more other features, steps, operations, elements and/or components.

The present invention relates to a gate-all-around field effect transistor with an extended source/drain (GAAFET) and a method of manufacturing the same.

As used herein, "extended source/drain" refers to a source/drain having a structure in which a side surface of the source/drain has an end portion extending in one direction.

In a typical GAAFET, since a width of channels formed on a substrate is the same as a distance between outer side surfaces of two internal spacers placed at opposite sides of a gate stack on the channels, a side surface of the source/drain adjoining the internal spacers is coplanar with a side surface of the source/drain adjoining the channels.

However, in a GAAFET according to the present invention, since the width of the channels formed on the substrate is shorter than the distance between the outer side surfaces of the two internal spacers placed at the opposite sides of the gate stack, an end portion of the side surface of the source/ drain adjacent the channels extends towards the channels beyond an end portion of the side surface of the source/drain adjacent the internal spacers.

With such an extended source/drain structure, the GAAFET according to the present invention can reduce RC delay by solving the problem of the typical GAAFET suffering from decrease in on-state current due to high resistance in a source/drain region. In addition, the GAAFET according to the present invention enables activation of dopants in the source/drain through substantial increase in stress applied to the channels in a longitudinal direction thereof, thereby facilitating application of laser annealing for formation of the source/drain.

Next, various structures of the GAAFET according to the present invention will be described with reference to the accompanying drawings. Here, the ZX Cartesian coordinates are shown in the drawings of a transistor structure to provide spatial context.

Figure 2:
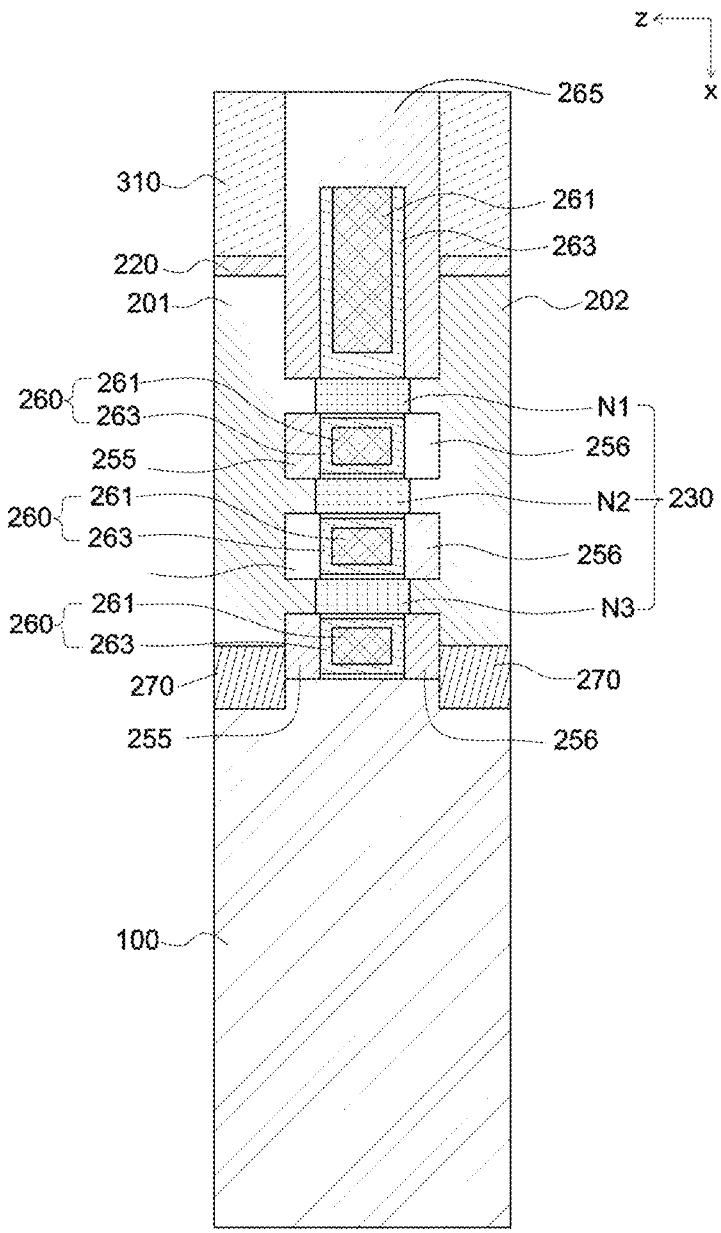
FIG. 2 is a sectional view of a GAAFET having a buried oxide (BOX) layer.

FIGS. 1 and 2 are sectional views of a GAAFET according to one embodiment of the present invention. Referring to FIGS. 1 and 2, the GAAFET according to this embodiment includes: a substrate 100, a plurality of channels 230 (N1, N2, N3) formed on the substrate 100 to be spaced apart from each other, a plurality of gate stacks 260 having a gate-all-around (GAA) structure surrounding at least a portion of each of the channels, and a source/drain 201, 202 disposed at one side of the gate stacks 260 and contacting the plurality of channels 230. In addition, the GAAFET according to the present invention includes external spacer 265 formed on opposite surfaces of the uppermost gate stack 260 and first and second internal spacers 255, 256 connected to the external spacer 265 and disposed between the gate stacks 260 and the source/drain 201, 202.

First, according to the present invention, the substrate 100 may be selected from any type of substrates typically used in the art without limitation. Specifically, the substrate 100 may be formed of Si, SiGe, Ge, Sn (tin), or Group III-V compounds that allow a top-down process, for example, aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), or indium antimonide (InSb).

The substrate 100 may be doped with few dopants or may be doped with one or more types of dopants selected from among P, As and Sb or one or more p-type dopants selected from among B, $BF_2$, Al, and Ga. The dopants introduced into the substrate 100 depend on the type of device (NFETs, PFETs) and may be p-type dopants for NFETs and n-type dopants for PFETs.

The GAAFET according to the present invention may include a structure wherein a buried oxide (BOX) layer is formed on at least a portion of the substrate 100. The buried oxide layer can suppress current leakage under the channels not controlled by the gates.

The buried oxide layer may be formed in various shapes. By way of example, the buried oxide layer may be formed as a single layer on the substrate 100, and the source/drain 201, 202 and the gate stacks 260 may be formed on the buried oxide layer. In another example, at least one groove (or trench) may be formed on an upper surface of the substrate 100 and the buried oxide layer 270 may be placed in the groove, as shown in FIG. 2. Here, an upper surface of the buried oxide layer 270 may be coplanar with the upper surface of the substrate 100. Alternatively, as shown in FIG. 2, the upper surface of the buried oxide layer 270 may be placed above the upper surface of the substrate 100 to form a structure wherein the buried oxide layer 270) protrudes from the substrate 100. When the buried oxide layer 270 has such a protruding structure, it is desirable that the upper surface of the buried oxide layer 270 be placed beneath an upper surface of the lowermost gate stack 260.

Although not shown in the drawings, the GAAFET according to the present invention may include a structure wherein a punch-through-stopper (PTS) region is formed on the substrate 100. To effectively prevent current leakage under the channels 230, the PTS region is formed by doping a predetermined region under the channels with different types of dopants than the dopants of the source/drain 201, 202 at high concentrations, followed by heat treatment of the corresponding region. The GAAFET can effectively suppress current leakage therein through formation of the PTS region.

According to the present invention, although the GAAFET may include the PTS region or the buried oxide layer on the substrate 100, the GAAFET may include a structure wherein both the PTS region and the buried oxide layer are formed on the substrate 100. In this structure, the buried oxide layer may be disposed in at least some region on the substrate 100 and the PTS region may be disposed on the substrate 100 and the buried oxide layer or between the substrate 100 and the buried oxide layer 270 (see FIG. 2), without being limited thereto.

The GAAFET according to the present invention includes the plurality of gate stacks 260 formed on the substrate 100 and spaced apart from each other. Each of the gate stacks 260 has a gate-all-around (GAA) structure surrounding at least a portion of the corresponding channel 230. In addition, each of the gate stacks 260 has first and second side surfaces at opposite sides in one direction.

Further, each of the gate stacks 260 may be a replacement metal gate. The replacement metal gate may include a gate electrode 261 and a gate dielectric 263 (that is, a gate dielectric layer or a stack of gate dielectric layers), such as a high-dielectric gate oxide layer and a high-dielectric interfacial layer.

The gate electrode 261 includes a work function metal, such as W, Al, Cr, Ni, and the like, and may include a metal barrier of Ti, TiN or Al, as needed. The gate dielectric 263 may be $SiO_2$, $Al_2O_3$, $HfO_2$, $ZrO_2$, $Si_3N_4$, perovskite oxide, and the like.

By way of example, the gate stacks 260 may have a stack structure of the gate dielectric/metal barrier/work function metal sequentially, without being limited thereto.

The GAAFET according to the present invention includes the plurality of channels 230 (N1, N2, N3) formed on the substrate 100 and spaced apart from each other. Each of the channels 230 (N1, N2, N3) has first and second side surfaces at the opposite sides in the one direction, as indicated by arrows in FIG. 1.

The channels 230 may be formed of at least one selected from among GaN, Si, Ge, SiGe, GaAS, W, Co. Pt, ZnO, and $In_2O_3$, without being limited thereto.

In addition, the channels 230 may be nanosheet channels. Alternatively, the channels 230 may have a nano-wire, nano-fiber, nano-rod or nano-ribbon shape known in the art and may be formed of a P-type or N-type semiconductor material. The number of layers constituting the channels is not limited to 3 and may be 1. In some embodiments, each of the channels 230 may include 2 to 10 layers and on-state current of the GAAFET may be adjusted through adjustment of the number of layers in each of the channels.

In the nanosheet structure of the GAAFET, the channels 230 may be active nanosheet channel layers N1, N2, N3.

Although not shown in the drawings, sacrificial nanosheet layers are formed between these active nanosheet channel layers N1, N2, N3. The sacrificial nanosheet layers may be formed of a sacrificial semiconductor material, such as Si or SiGe, at a different Ge concentration than the Ge concentration in a SiGe material for the active nanosheet channel layers. Here, the lowermost active nanosheet channel layer N3 includes Si. Preferably, the active nanosheet channel layers and the sacrificial nanosheet layer provide a Si/SiGe stack structure, in which the sacrificial nanosheet layer is placed near the substrate 100 and is formed of SiGe.

The GAAFET according to the present invention includes the source/drain 201, 202 disposed at opposite sides of the gate stacks 260 and adjoining the plurality of channels 230 (N1, N2, N3).

Here, the source/drain 201, 202 may be formed through epitaxial growth of a semiconductor material (for example, epitaxial Si material or SiGe material) on exposed sidewalls of the channels 230 (N1, N2, N3) and an exposed upper surface of the substrate 100. Accordingly, the source/drain 201, 202 are grown vertically (in the Z-axis direction) and laterally (in the Y-axis direction) on the substrate 100 and along the side surfaces of the channels 230 to extend therefrom.

The GAAFET according to the present invention includes a plurality of spacers for various purposes including insulation between layers and the like.

The external spacer 265 is placed on the uppermost channel layer N3 and on the opposite side surfaces of the gate stacks 260.

In addition, the first internal spacer 255 is disposed between the first side surface of the gate stack 260 and the source or drain 201. Here, the first internal spacer 255 may be disposed between the first side surface of one gate stack 260 among the plurality of gate stacks 260 and the source or drain 201 or 202, or may be disposed between the first side surface of at least one gate stack 260 among the plurality of gate stacks 260, preferably the first side surface of each of the gate stacks 260 excluding the uppermost gate stack 260, and the source or drain 201. More preferably, reference numeral 201 indicates the source and the first internal spacer 255 is disposed between the first side surface of the gate stack 260 and the source 201.

In addition, the second internal spacer 256 is disposed between the second side surface of the gate stack 260) and the source or drain 202. Here, the second internal spacer 256 may be disposed between the second side surface of one gate stack 260 among the plurality of gate stacks 260 and the source or drain 201 or 202, or may be disposed between the second side surface of at least one gate stack 260 among the plurality of gate stacks 260, preferably the second side surface of each of the gate stacks 260 excluding the uppermost gate stack 260, and the source or drain 202. More preferably, reference numeral 202 indicates the drain and the second internal spacer 256 is disposed between the second side surface of the gate stack 260 and the drain 202.

The first and second internal spacers 255, 256 may be connected to the external spacer 265.

Each of the external spacer 265 and the first and second internal spacers 255, 256 may include an insulating material, such as $SiO_2$, $Al_2O_3$, $HfO_2$, $ZrO_2$, $Si_3N_4$, perovskite oxide, and the like, without being limited thereto.

The external spacer 265, the first internal spacer 255 and the second internal spacer 256 may be formed of the same material or different materials.

In addition, the GAAFET according to the present invention includes the external spacer 265 formed on the opposite surfaces of the uppermost gate stack 260, the first internal spacer 255 disposed between one side surface of at least one gate stack 260 among the plurality of gate stacks 260 and the source 201, and the second internal spacer 256 disposed between the other side surface of the at least one gate stack 260 and the drain 202.

The GAAFET according to the present invention may include a silicide layer 220) and a contact metal layer on the source/drain 201, 202.

The silicide layer 220 may have a wrap-around-contact structure surrounding the source/drain 201, 202.

Preferably, the silicide layer 220 includes a metal silicide material, in which a metal typically used together with a semiconductor material is bonded to Si. By way of example, the silicide layer 220 may be a silicide material including, for example, Ni, Co, W, Ta, Ti, Pt, Er, Mo, Pd, or alloys thereof. More specifically, the metal silicide may include $NiSi_2$, $CoSi_2$, $WSi_2$, $TaSi_2$, $TiSi_2$, $PTIS_2$, $ErSi_2$, $MoSi_2$, $PdSi_2$, or combinations thereof, without being limited thereto. In addition, the silicide layer 220 may be composed of a single layer or multiple layers including the above materials.

The contact metal layer 310 may be filled with a metallic material, such as Co, W, Ru, and the like, for electrical connection to the source/drain 201, 202.

In the GAAFET according to the present invention, a distance from the first side surface to the second side surface of at least one channel among the plurality of channels 230, preferably all of the plurality of channels 230, is shorter than a distance from the first side surface of the first internal spacer 255 adjoining the source or the drain 201 to the second side surface of the second internal spacer 256 adjoining the drain or the source 202. Together with this structure, the GAAFET according to the present invention includes a structure wherein at least some region of the side surfaces of the source/drain 201, 202 extends towards the channels 230 to form protruding ends.

Figure 3:
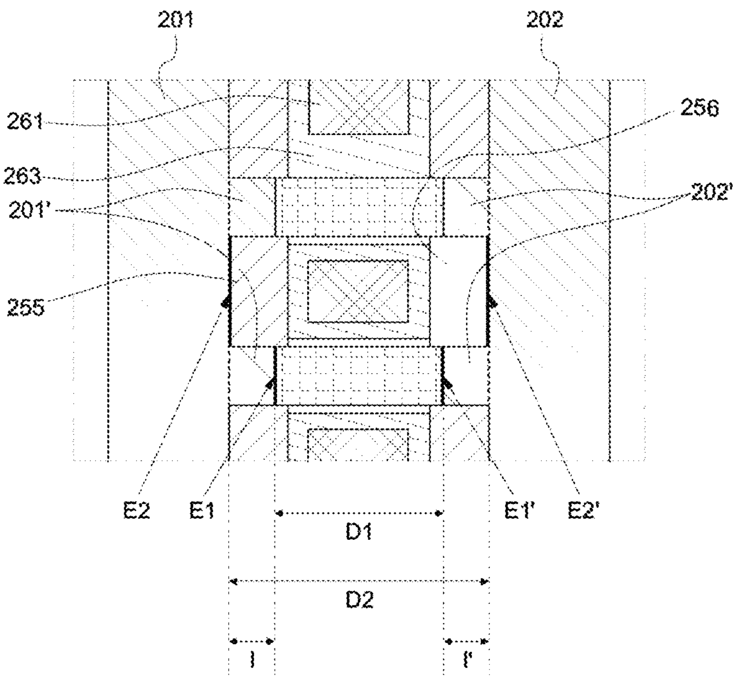
FIG. 3 is an enlarged view of Region A of FIG. 1.
Figure 4:
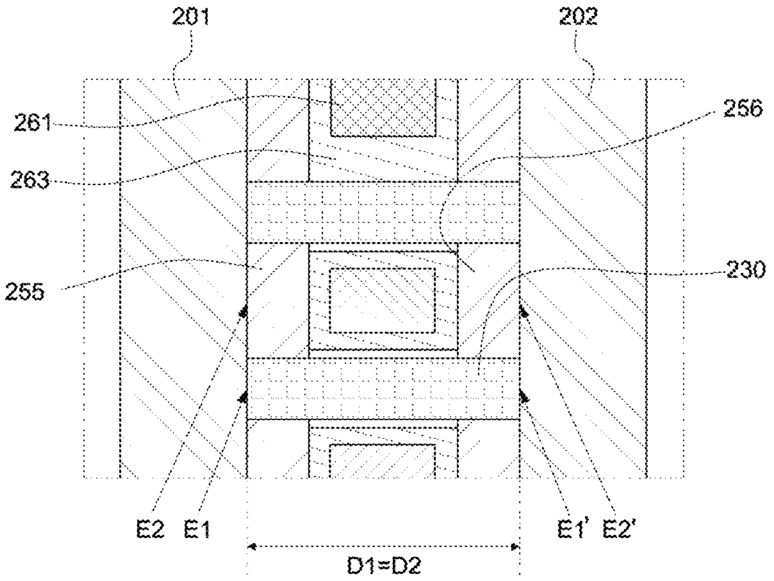
FIG. 4 is an enlarged view of the same region of a typical GAAFET device.

Although FIGS. 1 and 2 clearly show this structure, this structure is more clearly shown in FIG. 3, which is an enlarged view of Region A of FIG. 1. Here, FIG. 4 is an enlarged view of the corresponding region of a typical GAAFET.

Referring to FIG. 3, a distance D1 from the first side surface of the channel 230) to the second side surface thereof may be shorter than a distance D2 from the first side surface of the first internal spacer 255 disposed between the gate stack 260 on the channel 230 and the source or the drain 201 to the second side surface of the second internal spacer 256 disposed between the gate stack 260 and the drain or the source 202.

Here, a first end of a region of the side surface of the source or the drain 201 adjacent the first side surface of the channel 230 may be a first protruding end 201' that extends beyond a second end of a region of the side surface of the source or the drain 201 adjoining the first internal spacer 255 in the one direction (that is, towards the channel).

In addition, a first end of a region of the side surface of the drain or the source 202 adjacent the second side surface of the channel 230 may be a second protruding end 202' that extends beyond a second end of a region of the side surface of the drain or the source 202 adjoining the second internal spacer 256 in an opposite direction (that is, towards the channel) to the one direction.

The first and second protruding ends 201', 202' may have a rectangular shape, but are not limited thereto.

Outer circumferential surfaces of the first or second protruding ends 201' or 202' may adjoin the first or second side surface of the channel 230 while adjoining an exposed lower surface of the first or second internal spacer 255 or 256 adjacent the gate stack 260 placed on the channel 230 and an exposed upper surface of the first or second internal spacer 255 or 256 adjacent the gate stack 260 placed under the channel 230.

By way of example, when the first or second protruding end 201' or 202' has a rectangular shape, a side surface of the first or second protruding end 201' or 202' may adjoin the first or second side surface of the channel 230, an upper surface of the first or second protruding end 201' or 202' may adjoin the exposed lower surface of the first or second internal spacer 255 or 256 adjacent the gate stack 260 placed on the channel 230, and a lower surface of the first or second protruding end 201' or 202' may adjoin the exposed upper surface of the first or second internal spacer 255 or 256 adjacent the gate stack 260 placed under the channel 230.

FIG. 4 is an enlarged view of some regions of gate stacks, channels and a source/drain of a typical GAAFET, in which the same components are denoted by the same reference numerals for easy comparison with FIG. 3. As shown in FIG. 4, in the typical GAAFET, the distance D1 from the first side surface of the channel 230 to the second side surfaces thereof is the same as the distance D2 from the first side surface of the first internal spacer 255 disposed between the gate stack 260 on the channel 230 and the source or the drain 201 or 202 to the second side surface of the second internal spacer 256 disposed between the gate stack 260) and the drain or the source 202. As a result, planes E1, E1' on which the first ends of the source/drain 201, 202 adjoin the channels 230 are coplanar with planes E2, E2' on which the second ends of the source/drain 201, 202 adjoin the first and second internal spacers 255, 256, respectively. Accordingly, the side surfaces of the source/drain 201, 202 are formed in a vertical direction without roughness thereon.

On the other hand, as shown in FIG. 3, the GAAFET according to the present invention has a structure wherein the width of the channels 230 is smaller than a distance from an outer surface of the first internal spacer 255 to another outer surface of the second internal spacer 256 such that the first or second protruding end 201' or 202' of the source/drain 201, 202 in regions of the side surfaces of the source/drain 201, 202 adjacent the channels 230 protrudes and extends towards the channels 230 so as to adjoin the channels 230.

According to the present invention, a protruding length of the first or second protruding end 201' or 202' of the source/drain 201, 202 is defined by a distance I or I' between imaginary lines vertically extending from the plane E2 or E2' on which the second ends of the source/drain 201, 202 adjoin the first internal spacer 255 and from the plane E1 or E1' on which the first ends of the source/drain 201, 202 adjoin the channels 230.

The first or second protruding end 201' or 202' of the source/drain 201, 202 may extend beyond the second end of the side surface of the source/drain 201, 202 adjoining the internal spacer 255 or 256 in one direction or in the opposite direction by the distance I or I'.

Here, the distance I may be greater than 0% to less than 100%, for example, greater than 0%, 1% or more, 5% or more, 10% or more, 15% or more, 20% or more, 25% or more, 30% or more, or 35% or more of the width of the first internal spacer 255, and 99% or less, 95% or less, 90% or less, 85% or less, 80% or less, 75% or less, 70% or less, 65% or less, 60% or less, 55% or less, 50% or less, or 45% or less of the width of the first internal spacer 255. Preferably, the distance I is in the range of 20% to 95%, 25% to 90%, 30% to 85%, or 40% to 80% of the width of the first internal spacer 255, without being limited thereto.

In addition, the distance I' may be greater than 0% to less than 100%, for example, greater than 0%, 1% or more, 5% or more, 10% or more, 15% or more, 20% or more, 25% or more, 30% or more, or 35% or more of the width of the second internal spacer 256, and 99% or less, 95% or less, 90% or less, 85% or less, 80% or less, 75% or less, 70% or less, 65% or less, 60% or less, 55% or less, 50% or less, or 45% or less of the width of the second internal spacer 256. Preferably, the distance I' is in the range of 20% to 95%, 25% to 90%, 30% to 85%, or 40% to 80% of the second internal spacer 256, without being limited thereto.

According to the present invention, the width of the first internal spacer 255 or the second internal spacer 256 may depend on a process node (14 nm, 10 nm, 8 nm, 7 nm, 6 nm, 5 nm, 4 nm, 3 nm, 2 nm, or 1.8 nm) of GAAFET devices, without being limited thereto. In addition, the first internal spacer 255 may have the same width as or a different width than the second internal spacer 256.

By way of example, when the first internal spacer 255 or the second internal spacer 256 has a width of 5 nm and the gate stacks have a width of 12 nm, the first or second protruding end 201' or 202' of the source/drain 201, 202 may extends beyond the side surface of the source/drain 201, 202 adjoining the internal spacers 255, 256 in one direction (or in the opposite direction) by a length of greater than 0 nm to less than 5 nm, 1 nm to less than 5 nm, 1 nm to 4 nm, or 2 nm to 4 nm, without being limited thereto.

In the GAAFET device according to the present invention, the source/drain 201, 202 are formed and extend at the opposite ends of the channels 230 to improve on-state current and RC delay. Specifically, this structure can increase electrical conductivity under regions of the channels 230 having low electrical conductivity under the first and second internal spacers 255, 256 while improving attractive force/tension applied to the channels 230, thereby improving performance of the GAAFET device. Further, stress applied to the channels 230 in the longitudinal direction thereof is significantly increased to activate dopants in the source/drain 201, 202, thereby facilitating application of the laser annealing process for formation of the source/drain 201, 202.

A process for manufacturing the GAAFET having the extended source/drain structure according to the present invention is similar to a typical process except that a process for partially etching the channels is added and laser annealing is performed as an annealing process after formation of the source/drain.

Next, the process for manufacturing the GAAFET according to the present invention will be described.

Here, a method of forming each layer may include a deposition process, a lithography process and an etching process, and may include any other suitable processes or combinations thereof. Unless otherwise stated, each layer is formed by the deposition process, followed by the lithography process and the etching process.

The deposition process includes chemical vapor deposition (CVD), physical vapor deposition (PVD), atomic layer deposition (ALD), high density plasma CVD (HDPVD), metal organic CVD (MOCVD), remote plasma CVD (RPCVD), plasma enhanced CVD (PECVD), low pressure CVD (LPCVD), atomic layer CVD (ALCVD), atmospheric pressure CVD (APCVD), evaporation, plating, other suitable methods, or combinations thereof.

The lithography process may be any one of electron beam lithography, nanoimprinting, ion beam lithography. X-ray lithography, extreme ultraviolet lithography, photolithography (stepper, scanner, contact aligner, etc.), maskless lithography, and random dispersion of nanoparticles, without being limited thereto. Among these processes, the photolithography process includes resist coating (e.g., spin-on coating), soft baking, mask alignment, exposure, post-exposure baking, resist development, rinsing, drying [e.g., hard baking], other suitable processes, or combinations thereof.

The etching process includes dry etching, wet etching, other suitable etching processes, or combinations thereof. Here, an etching mask material may be an insulating film, such as $SiO_2$ or $SiN_x$, a metal, such as Cr, Ni, or Al, or a photoresist.

Figure 5:
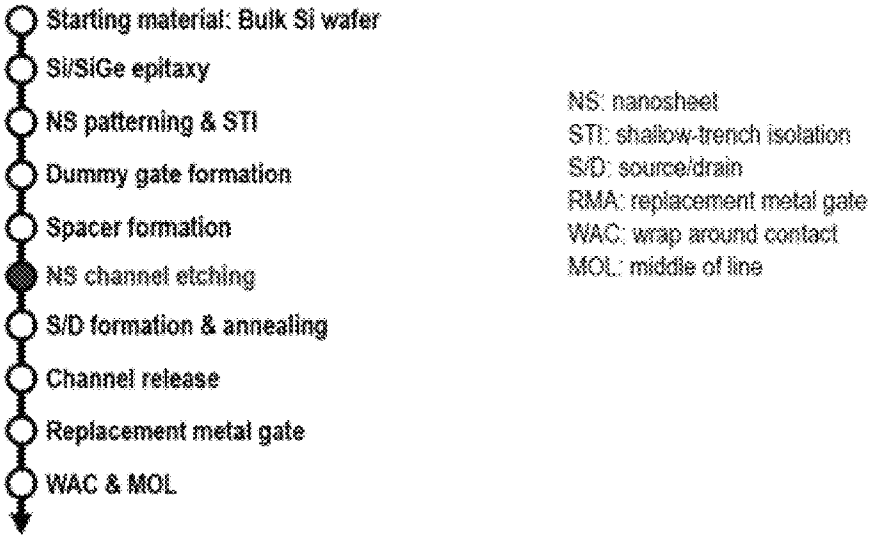
FIG. 5 is a flowchart of a process of manufacturing a GAAFET device according to the present invention.

FIG. 5 is a flowchart of a process of manufacturing a GAAFET device according to the present invention and FIG. 6 to FIG. 15 are views illustrating the process of manufacturing the GAAFET device. For the purpose of illustration, the following description will be given with reference to a Z-X half-sectional view of the GAAFET bisected into left and right sides along a centerline thereof.

First, prior to each of the processes described above, a substrate 100 may be prepared or a PTS region or a buried oxide (BOX) layer may be formed on the substrate.

The PTS region is formed by injecting a high concentration of dopants, which are a different type from the dopants in the source/drain 210, 202, into a predetermined region under the channels 230, followed by heat treatment. In order to prevent the GAAFET device from being damaged or disadvantageously affected by these processes, the PTS region is formed before selective epitaxial growth for formation of the source/drain 201, 202, preferably immediately before a process of forming a shallow trench isolation (STI) region.

Figure 6:
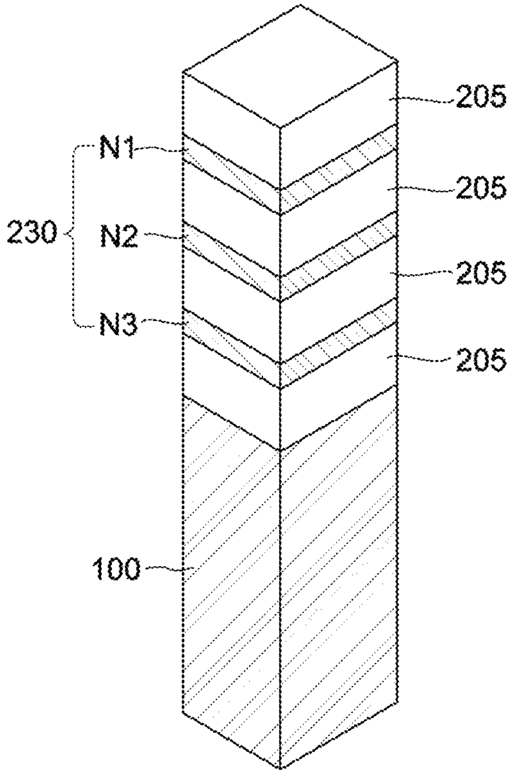
FIG. 6 to FIG. 15 are views illustrating the process of manufacturing the GAAFET device.

Next, a plurality of channels 230 and sacrificial layers 205 are alternately formed on the substrate 100 (FIG. 6)

The channels 230 may be active nanosheet channel layers (Si NS) and the sacrificial layers 205 may be sacrificial nanosheet layers (SiGe NS). The sacrificial nanosheet layers may be formed of a sacrificial semiconductor material, such as Si or SiGe, at a different Ge concentration than the Ge concentration in a SiGe material for the active nanosheet channel layers. In one embodiment, the active nanosheet channel layers include S, the sacrificial nanosheet layers include SiGe, and the lowermost sacrificial nanosheet layer includes SiGe. FIG. 6 shows a stack of SiGe/Si/SiGe/Si/SiGe/Si/SiGe layers sequentially formed from the lowermost layer.

Figure 7:
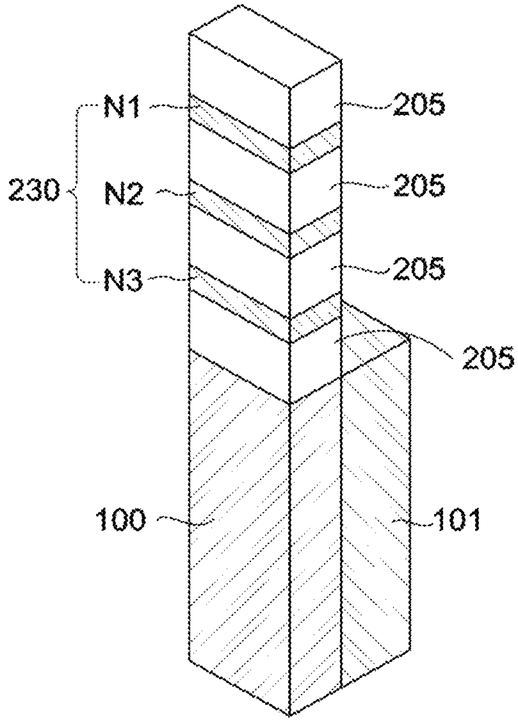

Next, a nanostructure and a shallow trench isolation (STI) region 101 are formed by vertically etching side surfaces of the channels 230 and the sacrificial layers 205 (FIG. 7).

An isolation insulation layer referred to as the STI region 101 may be formed of a suitable dielectric material selected from among low-k dielectrics such as silicon oxide, silicon nitride, silicon oxynitride, fluorine-doped silicate glass (FSG) and carbon-doped oxide, ultralow-k dielectrics such as porous carbon-doped silicon dioxide, polymers such as polyimide, and combinations thereof. As needed, the STI region 101 may be composed of a silicon oxide material obtained through thermal oxidation of the substrate 100.

Figure 8:
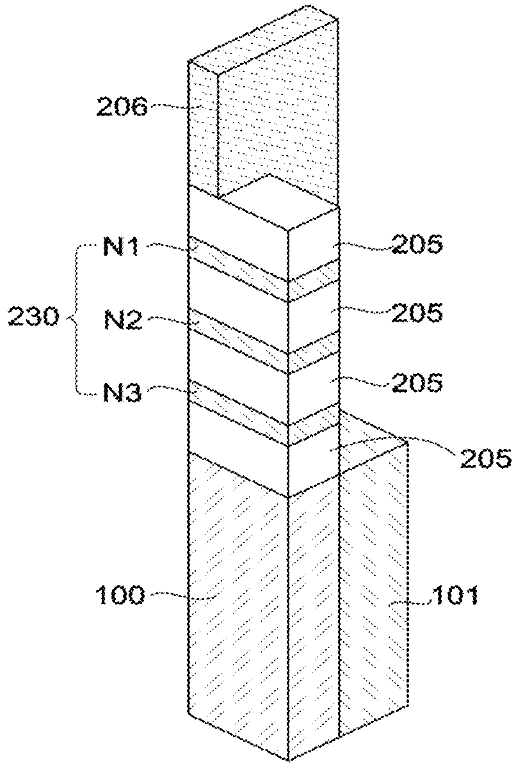

Next, a dummy gate 206 is formed to surround the channels 230 and the sacrificial layers 205 (FIG. 8). The dummy gate 206 may be a polysilicon gate and is formed by a patterning process after deposition.

Figure 9:
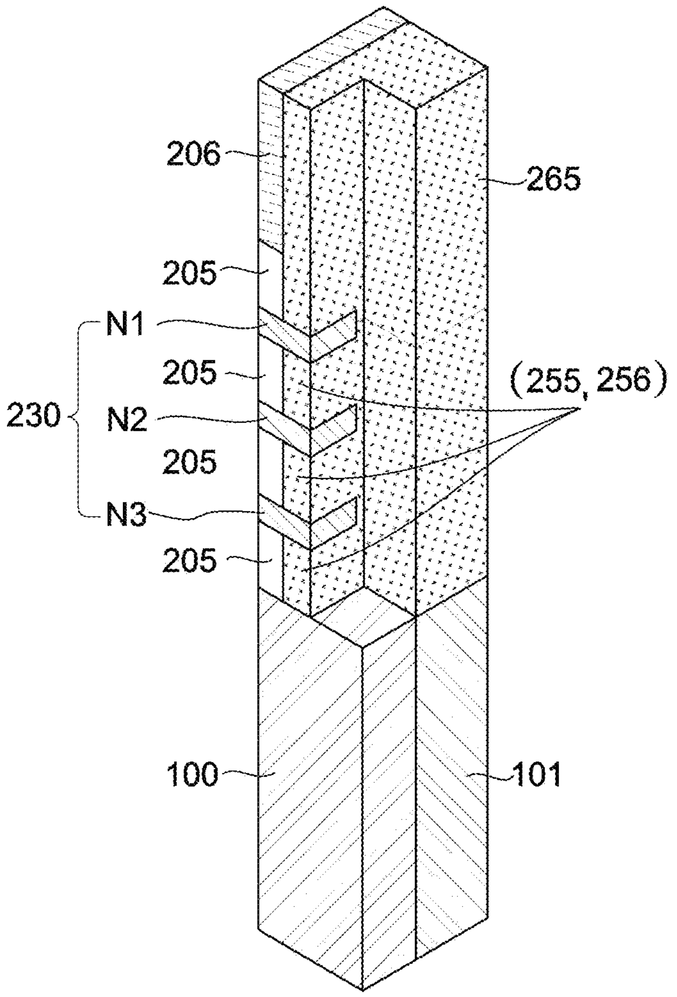

Next, an external spacer 265, a first internal spacer 255 and a second internal spacer 256 are formed using an insulating material after etching the channels 230 and the sacrificial layers 205 (FIG. 9).

Figure 10:
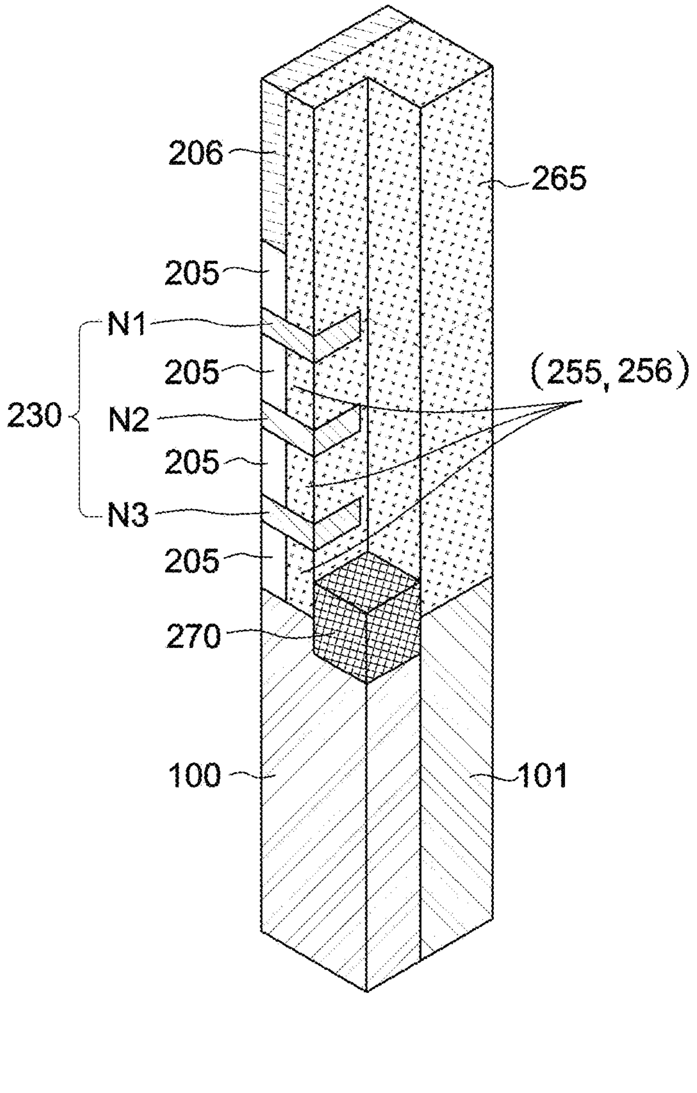

In this process, the external spacer 265 and the first and second internal spacers 255, 256 may be formed together with a buried oxide layer. That is, upon etching the channels 230 and the sacrificial layers 205, an upper portion of one side of the substrate 100 is etched to form a trench in the substrate 100. Then, upon formation of the external spacer 265 and the first and second internal spacers 255, 256 through deposition of the insulating material, the insulating material is also deposited onto the trench to form the buried oxide layer 270, as shown in FIG. 10.

Figure 11:
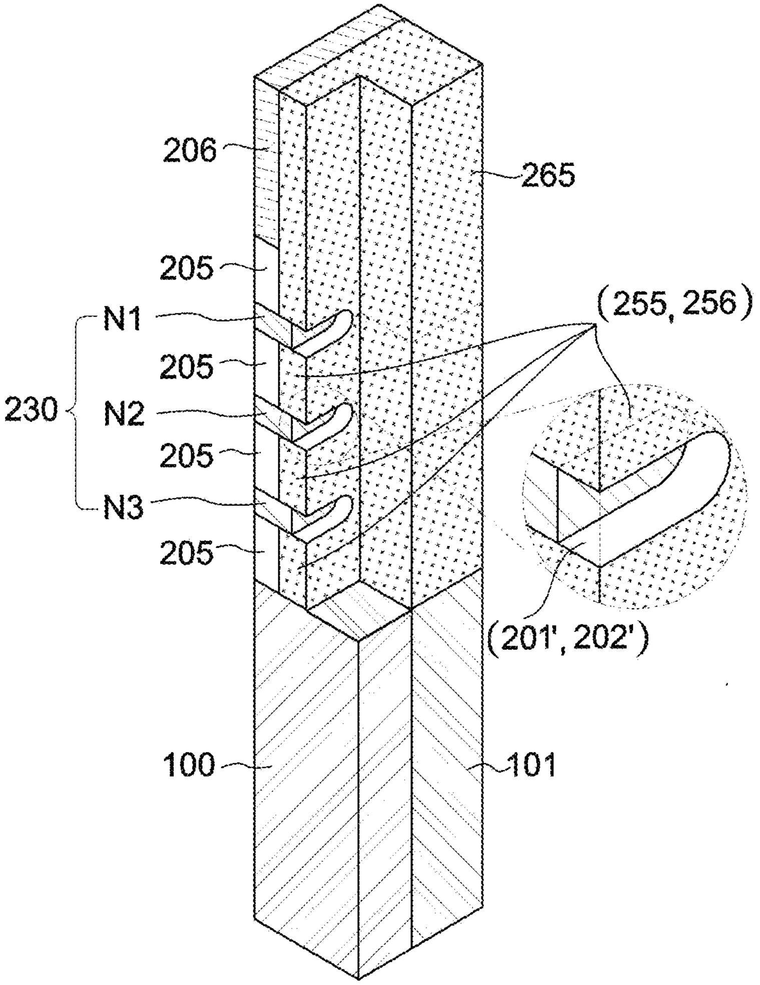

Next, grooves are formed by etching opposite ends of the channels 230 to a predetermined depth (FIG. 11).

Etching of the channels 230 may be realized by a selective etching process. The selective etching process refers to a process of selectively etching only the channels based on a difference in composition ratio between the channels 230 and the first and second internal spacers 255, 256 or a difference in etching rate therebetween due to a material difference therebetween. By way of example, the selective etching process may be performed by injecting $CF_4/O_2$ and/or $C_2F_6$ etching gas in the presence/absence of oxygen or argon based on selectivity between a Si material of the channels 230 and SiGe ($Si_{0.75}Ge_{0.25}$, low-K dielectric) of the first and second internal spacers 255, 256. Here, the etching gas may be changed depending on the materials for the channels 230 and the first and second internal spacers 255, 256.

Upon etching, an etching depth $T_{Si\_E}$ is adjusted such that a distance from one side surface of at least one channel 230 among the plurality of channels 230 to the other side surface of the at least one channel is shorter than a distance from one side surface of the first internal spacer 255 adjoining the source 201 to one side surface of the second internal spacer 256 adjoining the drain 202.

The etching depth $T_{Si\_E}$ of the channels 230 adjoining the source 201 corresponds to I defined in FIG. 3. Specifically, the etching depth $T_{Si\_E}$ of the channels 230 adjoining the source 201 is 99% or less, 95% or less, 90% or less, 85% or less, 80% or less, 75% or less, 70% or less, 65% or less, 60% or less, 55% or less, 50% or less, or 45% or less of the thickness of the first internal spacer 255. In addition, the etching depth $T_{Si\_E}$ of the channels 230 adjoining the source 201 is 1% or more, 5% or more, 10% or more, 15% or more, 20% or more, 25% or more, 30% or more, or 35% or more of the thickness of the first internal spacer 255. More preferably, the etching depth $T_{Si\_E}$ of the channels 230 adjoining the source 201 is in the range of 20% to 95%, 25% to 90%, 30% to 85%, or 40% to 80% of the thickness of the first internal spacer 255.

The etching depth $T_{Si\_E}$ of the channels 230 adjoining the drain 202 corresponds to I' defined in FIG. 3. Specifically, the etching depth $T_{Si\_E}$ of the channels 230 adjoining the drain 202 is 99% or less, 95% or less, 90% or less, 85% or less, 80% or less, 75% or less, 70% or less, 65% or less, 60% or less, 55% or less, 50% or less, or 45% or less of the thickness of the second internal spacer 256. In addition, the etching depth $T_{Si\_E}$ of the channels 230) adjoining the drain 202 is 1% or more, 5% or more, 10% or more, 15% or more, 20% or more, 25% or more, 30% or more, or 35% or more of the thickness of the second internal spacer 256. More preferably, the etching depth $T_{Si\_E}$ of the channels 230 adjoining the drain 202 is in the range of 20% to 95%, 25% to 90%, 30% to 85%, or 40% to 80% of the thickness of the second internal spacer 256.

The etching depth $T_{Si\_E}$ of the channels 230 adjoining the source 201 may be the same as or different from the etching depth $T_{Si\_E}$ of the channels 230 adjoining the drain 202.

According to one embodiment, the GAAFET is a 5 nm node device, in which the gates have a length of 12 nm, the first and second internal spacers 255, 256 have the same thickness Tis of 5 nm, and the etching depth $T_{Si\_E}$ of the channels 230 adjoining the source 201 and the etching depth $T_{Si\_E}$ of the channels 230 adjoining the drain 202 may be in the range of greater than 0 nm to less than 5 nm, 1 nm to less than 5 nm, 1 nm to 4 nm, or 2 nm to 4 nm.

By the etching process, the lower surface of the first or second internal spacer 255, 256 adjacent the gate stacks 260 placed on the channels 230 and the upper surface of the first or second internal spacer 255, 256 adjacent the gate stacks 260 placed under the channels 230 are exposed.

Figure 12:
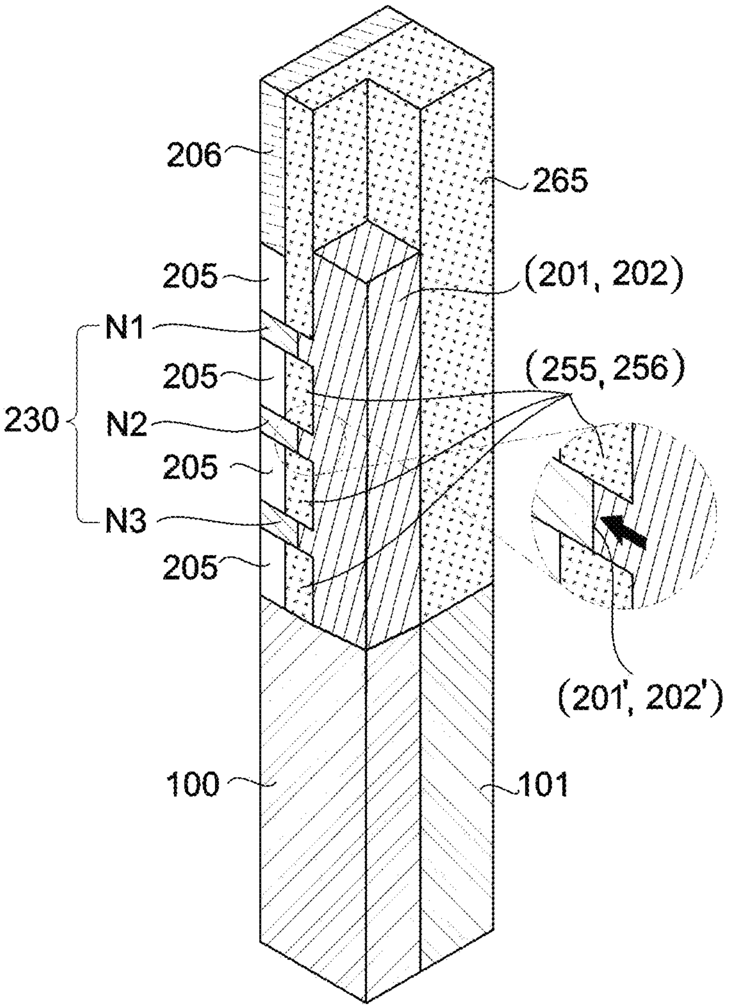

Next, selective epitaxial growth is performed to form a source/drain 201, 202 even in an etched region formed by etching the channels 230, thereby providing an extended source/drain 201, 202 (FIG. 12).

As a result, the GAAFET has a protruding structure wherein a first end of a region of the source 201 or the drain 202 adjacent one side surface of the channel 230 extends beyond a second end of a region of the source 201 or the drain 202 adjoining the first and second internal spacers 255, 256 in one direction.

Here, the protruding structure forms a first protruding end 201' and a second protruding end 202' protruding in one direction (that is, in a direction towards the channel).

In addition, the grown source/drain 201, 202 adjoin the exposed lower surface of the first or second internal spacer 255, 256 adjacent the gate stacks 260 placed on the channels 230 and the exposed upper surface of the first or second internal spacer 255, 256 adjacent the gate stacks 260 placed under the channels 230.

Selective epitaxial growth is realized through epitaxial growth of a semiconductor material (for example, epitaxial Si materials, SiC (silicon carbide) materials, or SiGe materials) on exposed sidewalls of the channels 230 (N1, N2, N3).

Selective epitaxial growth is performed by solid phase epitaxy (SPE), vapor phase epitaxy (VPE) or liquid phase epitaxy (LPE). In one embodiment, an epitaxial layer may be formed through epitaxial growth (for example, hetero-epitaxy) using chemical vapor deposition (CVD), reduced pressure chemical vapor deposition (RPCVD), ultra-high vacuum chemical vapor deposition (UHCVD) or molecular beam epitaxy (MBE).

By selective epitaxial growth, the source/drain 201, 202 are grown vertically (in the Z-axis direction) and laterally (in the Y-axis direction) along the side surfaces of the channels 230 to protrude therefrom.

By selective epitaxial growth, n-type or p-type dopants are implanted into the source/drain 201, 202 without a separate ion implantation process.

The type of dopants depends on the type of device (NMOS, PMOS) and may be n-type dopants for NMOS and p-type dopants for PMOS. By way of example, the channels may be doped with one or more n-type dopants selected from among P, As, and Sb; and at least one p-type dopant selected from among B, $BF_2$, Al, and Ga.

As needed, in order to improve a stress effect of the channels 230, these dopants may be mixed with Si, SiGe, Ge, Sn (tin), or a group III-V compound. The group III-V compound may be, for example, aluminum phosphide (AlP), gallium phosphide (GaP), indium phosphide (InP), aluminum arsenide (AlAs), gallium arsenide (GaAs), indium arsenide (InAs), aluminum antimonide (AlSb), gallium antimonide (GaSb), or indium antimonide (InSb).

For activation of the dopants, laser annealing is performed. Unlike RTA in which the entirety of the substrate is heated, laser annealing minimizes diffusion of the dopants implanted into the source/drain by allowing local laser scanning only on the source/drain regions.

By way of example, laser annealing may be realized by various methods, such as excimer laser annealing (ELA) using excimer laser beams as pulsed UV light, laser spike annealing (LSA) using laser beams having a very short duration, flash lamp annealing (FLA), diode laser annealing (DLA), and the like.

Figure 13:
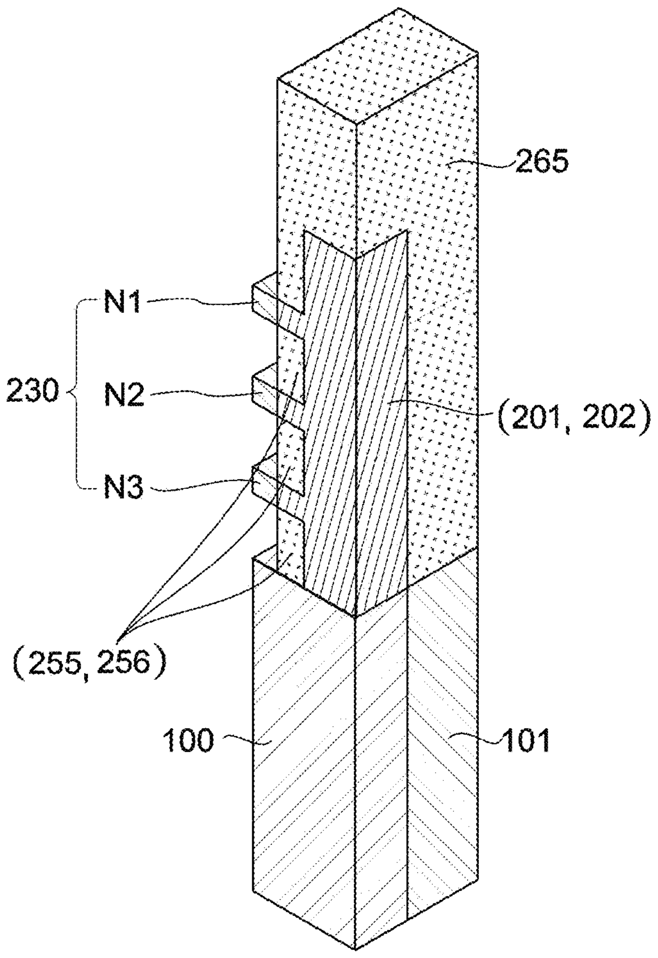

Next, a channel release process is performed (FIG. 13).

Figure 14:
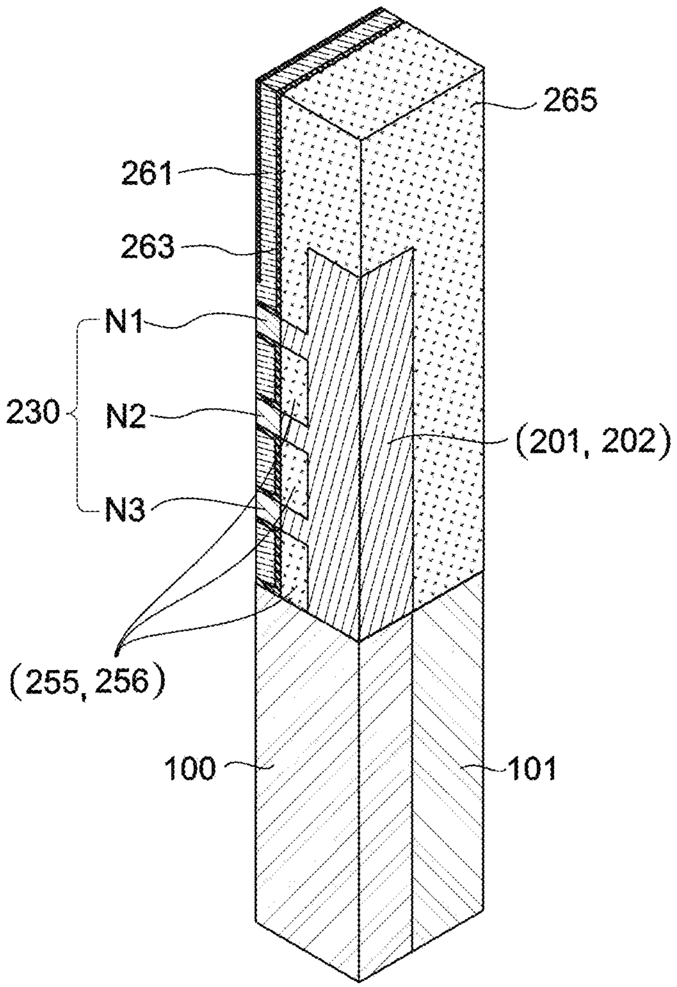

Next, gate stacks 260 are formed by performing a replacement metal gate (RMG) formation process (FIG. 14).

The gate stacks 260 are formed by removing the dummy gate 206 and then depositing a gate electrode 261 and gate dielectrics 263, and have a three-dimensional GAA structure surrounding upper, lower and/or side surfaces of the channels 230, as shown in FIG. 1.

Figure 15:
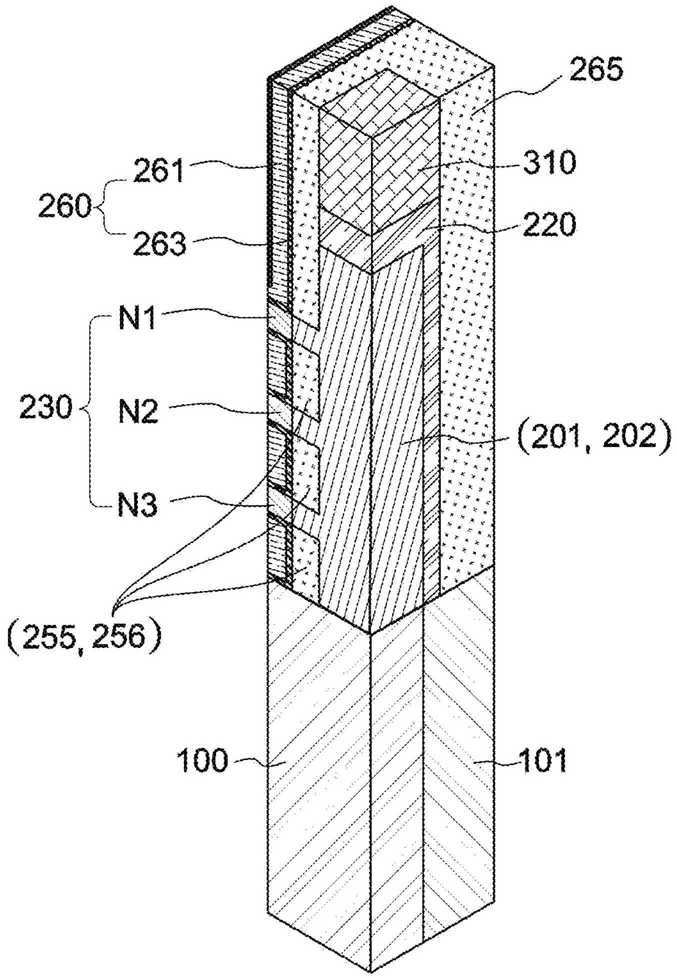

Next, after formation of a silicide region 220 on the source/drain 201, 203, a contact metal layer 310 is formed through a wrap-around-contact (WAC) and middle-of-line (MOL) process, in which a contact opening is filled with a metal (FIG. 15).

The source/drain 201, 203 includes a silicon or polysilicon material and the silicide region 220 is formed through implantation of metal ions, such as Ni, Co, W, Ta, Ti, Pt, Er, Mo, Pd, or alloys thereof, into the source/drain 201, 203. The silicide region 220 is formed to surround the source/drain 201, 203.

Formation of the contact metal layer 210 may be performed through deposition of a metallic material, such as Co, W, Ru, and the like, into the contact opening.

The GAAFET device having the extended source/drain structure can solve the problem of reduction in on-state current due to high resistance in the source/drain region in the related art and can reduce RC delay through increase in parasitic capacitance by disposing the extended source/drain structure adjacent the gates. In addition, stress applied to the channels in the longitudinal direction thereof is significantly increased to activate the dopants in the source/drain, thereby facilitating application of laser annealing for formation of the source/drain.

GAAFET devices were manufactured according to scaling of the following Table 1. Here, in order to avoid influence of a parasitic bottom transistor on the PTS region, the GAAFET devices had a buried oxide structure, as shown in FIG. 2. An S/D doping density for NFETs and PFETs was set to $4\times10^{20}$ $cm^{-3}$ and $Si_{0.98}C_{0.02}$ ($Si_{0.5}Ge_{0.5}$) was used to induce stress to the NFETs (PFETs). Physical parameters were well corrected based on a high-level 5 nm node FinFET. Drain bias was set to $|0.7|$ V (50 mV) for saturation (linear) operation and the geometric parameters for TCAD simulation are listed in Table 1.

TABLE 1

| | Numerical value |
|---|---|
| Fixed parameter | |
| Contact poly pitch (CPP) | 42 nm |
| Fin pitch (FP) | 60 nm |
| Gate length ($L_g$) | 12 nm |
| Spacing thickness ($T_{sp}$) | 10 nm |
| NS thickness ($T_{ch}$) | 5 nm |
| Interfacial layer/$HfO_2$ thickness ($T_{IL}/T_{HK}$) | 0.6 nm/1.1 nm |
| Inner spacer thickness ($T_{IS}$) | 5 nm |

TABLE 1-continued

| | Numerical value |
|---|---|
| S/D doping concentration ($N_{SD}$) | $4 \times 10^{20}$ cm$^{-3}$ |
| PTS doping concentration ($N_{PTS}$) | $5 \times 10^{18}$ cm$^{-3}$ |
| Changed parameter | |
| $T_{Si\_E}$ | 0 nm, 1 nm, 2 nm, 3 nm, 4 nm |

[Heat Treatment]

RTA (at 1,050° C. for 0.5 sec)

LSA (at 1,050° C. for 1 msec)

Figure 16:
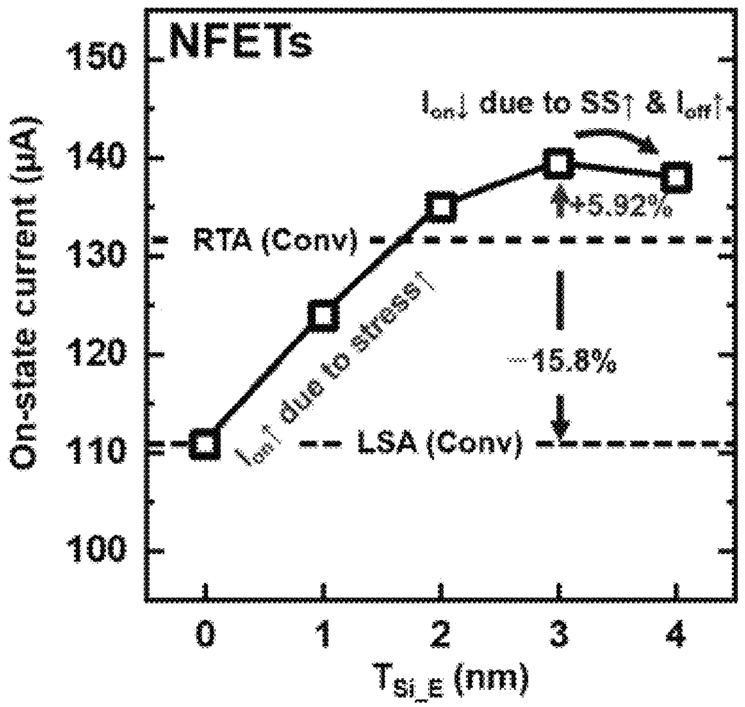
FIG. 16 is a graph depicting variation of on-state current of GAAFET devices (NFETs) according to $T_{Si\_E}$.
Figure 17:
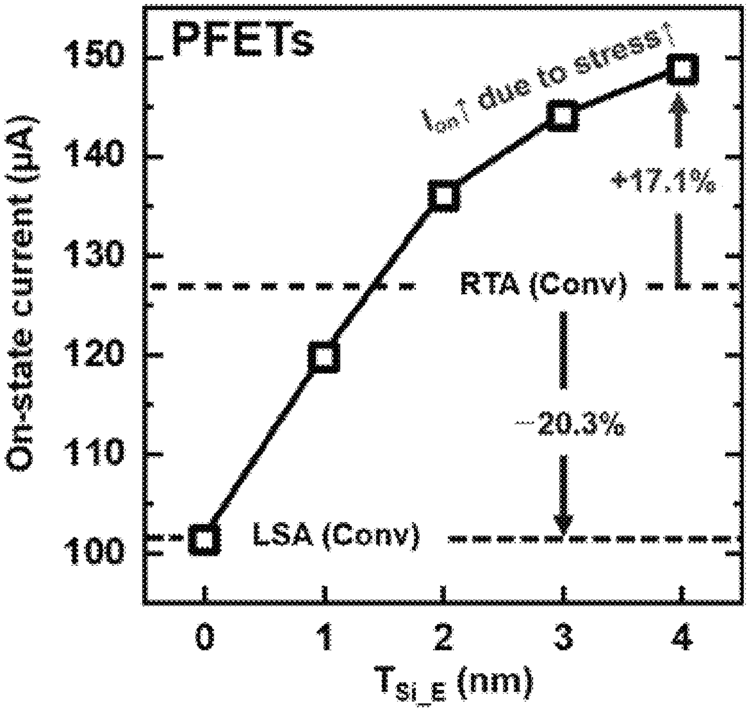
FIG. 17 is a graph depicting variation of on-state current of GAAFET devices (PFETs) according to $T_{Si\_E}$.

FIG. 16 and FIG. 17 are graphs depicting variation of on-state current of GAAFETs according to $T_{Si\_E}$, in which FIG. 16 shows variation of on-state current of NFETs and FIG. 17 shows variation of on-state current of PFETs. Here, RTA stands for rapid thermal annealing and LSA stands for laser spike annealing. In addition, $T_{Si\_E}$ means the widths (w) of grooves H', H" formed by etching.

Referring to FIG. 16, the NFETs had higher on-state current when LSA was performed without etching the channels 230 than when RTA was performed without etching the channels 230. However, as $T_{Si\_E}$ was increased, the on-state current was increased and reached a higher value at $T_{Si\_E}$ of about 2 nm, as compared to RTA. Such trend is similar to the PFETs shown in FIG. 16. However, the NFETs showed a slight decrease in on-state current at $T_{Si\_E}$ of 4 nm, whereas the PFETs showed a continuous increase in on-state current was observed. From these results, it can be seen that the on-state current of the GAAFET devices subjected LSA after partial etching of the channels 230 can be improved by about 20% to 30%.

Figure 18:
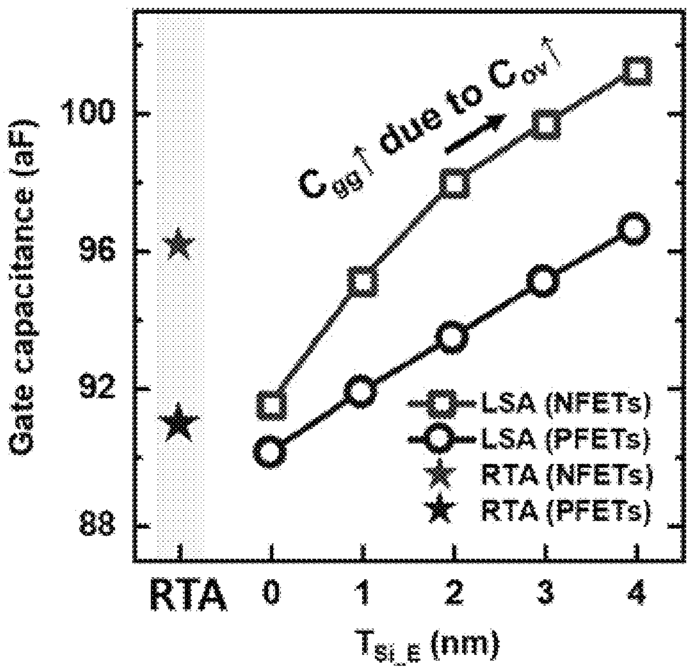
FIG. 18 is a graph depicting variation of gate capacitance according to $T_{Si\_E}$.
Figure 19:
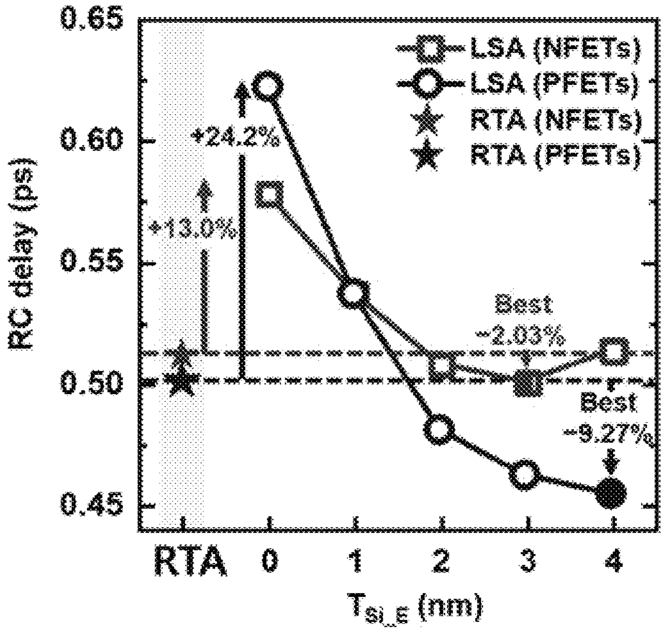
FIG. 19 is a graph depicting variation of RC delay according to $T_{Si\_E}$.

FIG. 18 and FIG. 19 are graphs depicting reduction of RC delay, in which FIG. 18 shows variation of gate capacitance depending upon $T_{Si\_E}$ and FIG. 19 shows variation of RC delay depending upon $T_{Si\_E}$.

For the GAAFET devices according to the present invention, the distances between the gates 261 and the extended the source/drain 201, 202 were reduced through partial etching of the channels 230, thereby increasing gate capacitance Cgg together with overlapping capacitance Cov depending upon $T_{Si\_E}$, as shown in FIG. 6, through significant reduction in electrical conductivity therebetween. The gate capacitance Cgg tended to increase for both the NFETs and the PFETs as the distances between the gate 261 and the source/drain 201, 202 decreased, that is, as $T_{Si\_E}$ increased.

Referring to FIG. 19, RC delay tended to decrease with increasing $T_{Si\_E}$. At $T_{Si\_E}$ of 2 nm, the GAAFET devices subjected to LTA exhibited lower RC delay values than the GAAFET devices subjected to RTA. From this result, it can be seen that the GAAFET devices subjected to partial etching of the channels 230 is more advantageous for high-speed operation through reduction in RC delay by about 15% to 33% than the GAAFET devices not subjected to partial etching of the channels 230.

Figure 20:
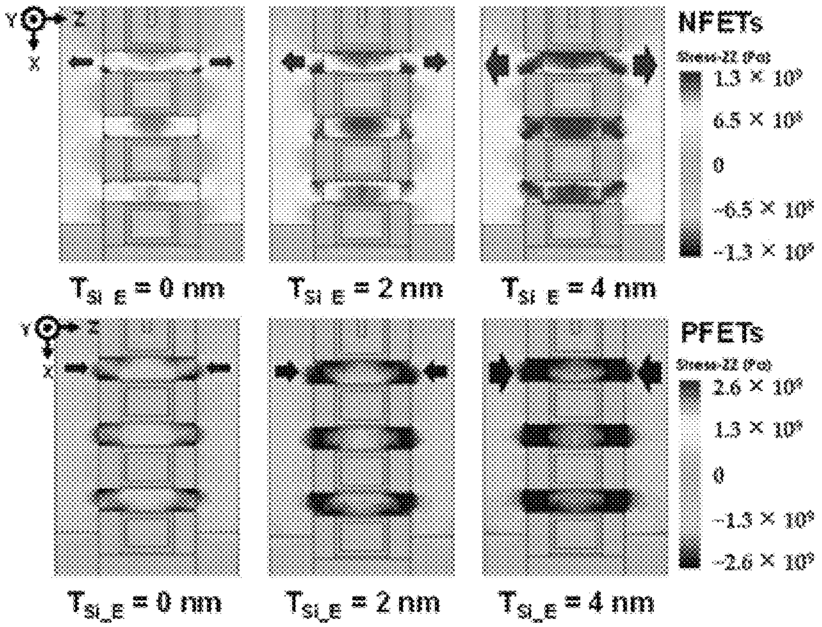
FIG. 20 is a stress profile according to a channel length direction (Szz)
Figure 21:
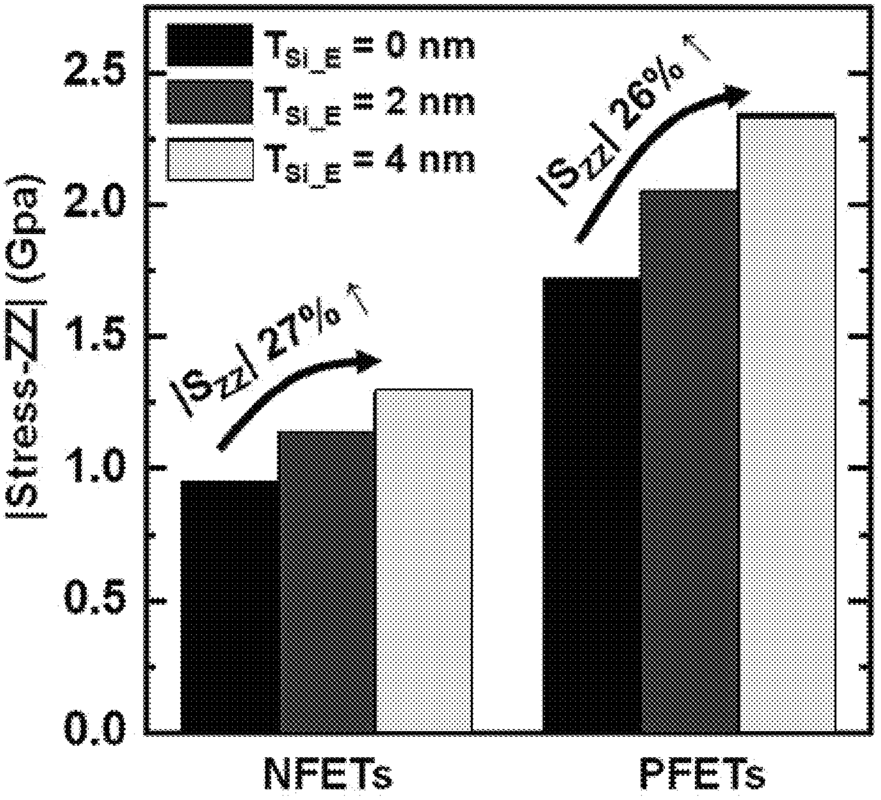
FIG. 21 is a graph depicting variation of a channel direction stress (Stress-ZZ).

FIG. 20 and FIG. 21 are views for illustration of activation of the source/drain 201, 202 according to $T_{Si\_E}$, in which FIG. 20 is a stress profile Szz in the longitudinal direction of the channels 230 and FIG. 21 is a stress profile Stress-ZZ in the direction of the channels 230.

Referring to FIG. 20, stress of the channels 230 was increased in regions under the internal spacers 255 by extension of the source/drain 201, 202 through partial etching of the channels 230. FIG. 21 is a graph that quantifies this result, showing that, as $T_{Si\_E}$ increased, the stress increased through extension of the source/drain 201, 202, and this trend occurred for both the NFETs and the PFETs. The increased stress Szz can affect ionic activation of the source/drain 201, 202, thereby causing a significant increase in carrier mobility.

Although some embodiments have been described herein, it should be understood that these embodiments are given by way of illustration only and that various modifications, changes, and alterations can be made by those skilled in the art without departing from the spirit and scope of the present invention. Therefore, the scope of the invention should be limited only by the accompanying claims and equivalents thereto.

LIST OF REFERENCE NUMERALS

100: Substrate
101: STI
201, 202: Source/drain
201', 202': First and second protruding ends
205: Sacrificial layer
206: Dummy gate
220: Silicide layer
N1, N2, N3, 230: Channel
255: First internal spacer
256: Second internal spacer
260: Gate stack
261: Gate electrode
263: Gate dielectric
265: External spacer
270: Buried oxide layer
310: Contact metal layer

The invention claimed is:

1. A gate-all-around field effect transistor comprising:

a plurality of channels formed on a substrate to be spaced apart from each other and each comprising a first side surface and a second side surface at opposite sides in one direction;

a plurality of gate stacks each having a gate-all-around (GAA) structure surrounding at least a portion of the channel and comprising a first side surface and a second side surface at the opposite sides in the one direction;

a source/drain disposed at one side of the gate stacks and contacting the plurality of channels; and a first internal spacer and a second internal spacer disposed between one side surface of at least one gate stack among the plurality of gate stacks and the source and between the other side surface of the at least one gate stack and the drain, respectively, wherein, in the one direction, a distance from one side surface of at least one channel among the plurality of channels to the other side surface thereof is shorter than a distance from one side surface of the first internal spacer adjoining the source to one side surface of the second internal spacer adjoining the drain, and wherein a first end of the source or the drain extends beyond a second end thereof in the one direction by a length of 20% or more and 95% or less of a thickness of the first internal spacer or the second internal spacer.

2. The gate-all-around field effect transistor according to claim 1, wherein a distance from one side surface of the channel to the other side surface of the channel is greater than a width of the gate stack placed on the channel.

3. The gate-all-around field effect transistor according to claim 1, wherein a distance from one side surface of the channel to the other side surface of the channels is shorter than a distance from a first side surface of the first internal spacer disposed between the gate stack on the channel and the source or the drain to a second side surface of the second internal spacer disposed between the gate stack and the source or the drain.

4. The gate-all-around field effect transistor according to claim 1, further comprising: a punch-through-stopper (PTS) region on the substrate.

5. The gate-all-around field effect transistor according to claim 1, further comprising: a buried oxide layer inside the substrate or between the substrate and the source/drain.

6. The gate-all-around field effect transistor according to claim 1, wherein the first end of the source or the drain extends beyond a second end thereof in the one direction by a length of 20% or more and 80% or less of a thickness of the first internal spacer or the second internal spacer.

7. The gate-all-around field effect transistor according to claim 1, wherein the first end of the source or the drain extends beyond a second end thereof in the one direction by a length of 40% or more and 80% or less of a thickness of the first internal spacer or the second internal spacer.

* * * * *